United States Patent
Yan et al.

(10) Patent No.: US 12,446,209 B2
(45) Date of Patent: Oct. 14, 2025

(54) SEMICONDUCTOR STRUCTURE AND METHOD FOR FABRICATING THE SAME

(71) Applicant: CHANGXIN MEMORY TECHNOLOGIES, INC., Hefei (CN)

(72) Inventors: Dong Yan, Hefei (CN); Zijie Wang, Hefei (CN); Jun Wei, Hefei (CN); Wei Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 444 days.

(21) Appl. No.: 18/149,671

(22) Filed: Jan. 4, 2023

(65) Prior Publication Data
US 2023/0422480 A1 Dec. 28, 2023

(30) Foreign Application Priority Data
Jun. 24, 2022 (CN) .......................... 202210727229.X

(51) Int. Cl.
*H10B 12/00* (2023.01)

(52) U.S. Cl.
CPC ....... *H10B 12/315* (2023.02); *H10B 12/0335* (2023.02); *H10B 12/05* (2023.02); *H10B 12/482* (2023.02)

(58) Field of Classification Search
CPC .. H10B 12/315; H10B 12/482; H10B 12/488; H10D 64/01; H10D 64/512
See application file for complete search history.

(56) References Cited

U.S. PATENT DOCUMENTS

| | | | |
|---|---|---|---|
| 9,306,022 B1* | 4/2016 | Oh ........................ | H10D 64/513 |
| 2007/0082448 A1* | 4/2007 | Kim ...................... | H10B 12/053 |
| | | | 257/E21.41 |
| 2010/0237405 A1* | 9/2010 | Shin ........................ | H10D 30/63 |
| | | | 438/269 |
| 2023/0231008 A1* | 7/2023 | Jang ........................ | H10D 84/83 |

FOREIGN PATENT DOCUMENTS

CN 114256158 A 3/2022

\* cited by examiner

*Primary Examiner* — Steven M Page
(74) *Attorney, Agent, or Firm* — Kilpatrick Townsend & Stockton LLP

(57) ABSTRACT

Embodiments provide a semiconductor structure and a method for fabricating the same. The method includes: providing a substrate; forming, in the substrate, active pillars spaced and isolation layers configured to isolate the active pillars; forming, in an active pillars and an isolation layers, word line trenches extending along a first direction; and forming a first word line in the first word line trench and a second word line in the second word line trench, where opposite surfaces of the first word line form a first gate channel together with the active pillar, opposite surfaces of the second word line form a second gate channel together with the active pillar, and sum of a width of the first gate channel along the first direction and a width of the second gate channel along the first direction is greater than a perimeter of the active pillar.

20 Claims, 17 Drawing Sheets

SEMICONDUCTOR STRUCTURE AND METHOD FOR FABRICATING THE SAME

CROSS-REFERENCE TO RELATED APPLICATION

This application claims priority to Chinese Patent Application No. 202210727229.X, titled "SEMICONDUCTOR STRUCTURE AND METHOD FOR FABRICATING THE SAME" and filed to the State Patent Intellectual Property Office on Jun. 24, 2022, the entire contents of which are incorporated herein by reference.

TECHNICAL FIELD

Embodiments of the present disclosure relate to the field of semiconductor technology, and more particularly, to a semiconductor structure and a method for fabricating the same.

BACKGROUND

With the development of semiconductor structures towards integration, dimensions of the semiconductor structures are getting smaller and smaller. For example, in processes of fabricating dynamic random access memory (DRAM), when a vertical gate-all-around (GAA) transistor is used as an access transistor, an area occupied by the GAA transistor may reach $4F^2$, which can increase number of memory cells per unit area and increase density of arrangement.

However, drive energy consumption of the semiconductor structures in the related technologies is higher, such that performances of the semiconductor structures are reduced.

SUMMARY

In view of the above problem, embodiments of the present disclosure provide a semiconductor structure and a method for fabricating the same, to increase a width of a gate channel of a transistor and reduce drive power consumption of the semiconductor structure, and thus improving performance of the semiconductor structure.

A first aspect of embodiments of the present disclosure provides a method for fabricating a semiconductor structure, and the method includes following steps of: providing a substrate; forming, in the substrate, a plurality of active pillars arranged at intervals and isolation layers configured to isolate the plurality of active pillars; forming, in a given one of the plurality of active pillars and a given one of the isolation layers, a plurality of word line trenches extend along a first direction, where each of the plurality of word line trenches is configured to communicate with the plurality of active pillars positioned in the same first direction, and each of the plurality of word line trenches includes a first word line trench and a second word line trench spaced along a second direction; and forming a first word line in the first word line trench and a second word line in the second word line trench, in the second direction, opposite surfaces of the first word line forming a first gate channel together with the given active pillar, opposite surfaces of the second word line forming a second gate channel together with the given active pillar, sum of a width of the first gate channel along the first direction and a width of the second gate channel along the first direction being greater than a perimeter of the given active pillar, and the first direction intersecting with the second direction.

A second aspect of the embodiments of the present disclosure provides a semiconductor structure, which includes: a substrate; a plurality of active pillars, the plurality of active pillars being arranged at intervals on the substrate; isolation layers arranged between the plurality of active pillars, the isolation layers being configured to isolate the plurality of active pillars; and a plurality of word lines spaced along the second direction, a part of each of the plurality of word lines being embedded in the plurality of active pillars and being communicated with the plurality of active pillars positioned in the same first direction, each of the plurality of word lines comprising a first word line and a second word line extending along a first direction and arranged at intervals, a first gate channel being formed between the first word line and each of the plurality of active pillars, a second gate channel being formed between the second word line and each of the plurality of active pillars, sum of a width of the first gate channel along the first direction and a width of the second gate channel along the first direction being greater than a perimeter of each of the plurality of active pillars, and the first direction intersecting with the second direction.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figure 1:
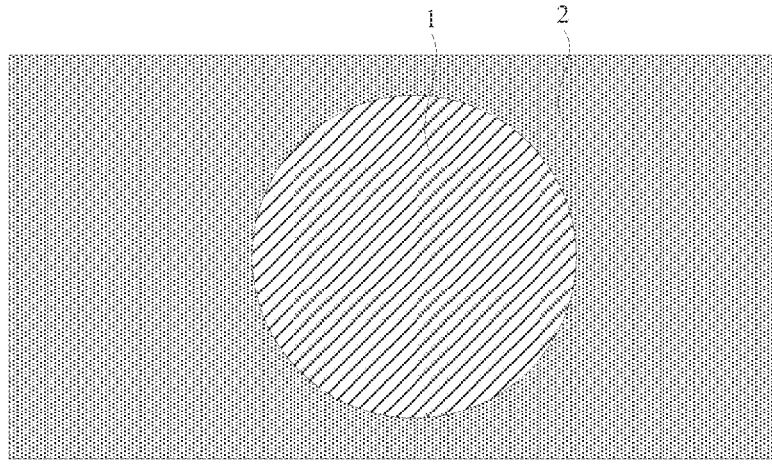
FIG. 1 is a schematic structural diagram of active pillars and word lines provided in the related technologies.

As mentioned in the background art, a semiconductor structure in related technologies has a problem of higher drive power consumption. After research, it is found that a reason for this problem is as below. Referring to FIG. 1, a vertical gate-all-around (GAA) transistor in the related technologies generally includes cylindrical active pillars 1 and word lines 2 surrounding a portion of the active pillars 1, intersections between the word lines 2 and the active pillars 1 form gates, annular gate channels are formed between the gates and the active pillars, and a width of the gate channel=$2\pi r$=6.28r. As a dimension of the semiconductor structure is getting smaller and smaller, a radius r of the active pillar gradually decreases, such that widths of the gate channels are reduced, which increases the drive power consumption of the semiconductor structure and reducing performance of the semiconductor structure.

In view of the above technical problems, embodiments of the present disclosure provide a semiconductor structure and a method for fabricating the same. The first word line and the second word line penetrate through the active pillar along the first direction, and in the second direction, opposite surfaces of the first word line form a first gate channel together with the active pillar, opposite surfaces of the second word line form a second gate channel together with the active pillar. In this way, number of the gate channels may be increased, such that sum of a width of the first gate channel along the first direction and a width of the second gate channel along the first direction is greater than a perimeter of the active pillar. Thus, the width of the gate channel is increased, power consumption of a transistor is reduced, and the performance of the semiconductor structure is improved.

To make the above objectives, features, and advantages of the embodiments of the present disclosure more apparent and lucid, the technical solutions in the embodiments of the present disclosure will be described clearly and completely below with reference to the accompanying drawings in the embodiments of the present disclosure. Apparently, the described embodiments are merely some but not all of the embodiments of the present disclosure. All other embodiments obtained by persons of ordinary skill in the art based on the embodiments of the present disclosure without creative efforts shall fall within the protection scope of the present disclosure.

This embodiment does not impose restrictions on the semiconductor structure, and an introduction will be made below by taking an example where the semiconductor structure is a dynamic random access memory (DRAM), but this embodiment is not limited thereto, and the semiconductor structure in this embodiment also may be other structures.

Figure 2:
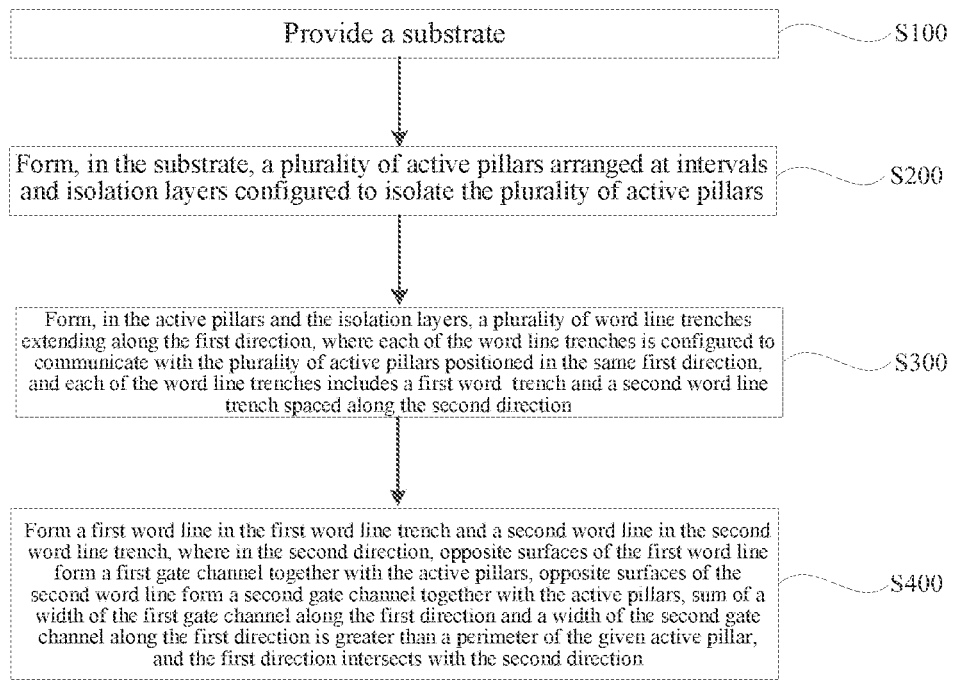
FIG. 2 is a process flow diagram of a method for fabricating a semiconductor structure according to an embodiment of the present disclosure.

Referring to FIG. 2, the method for fabricating the semiconductor structure provided by the embodiments of the present disclosure includes following steps.

Step S100: providing a substrate.

The substrate 10 may be made of a semiconductor material, which may be one or more of silicon, germanium, silicon germanium (SiGe), silicon carbide, silicon on insulator (SOI) or germanium on insulator (GOI).

Step S200: forming, in the substrate, a plurality of active pillars arranged at intervals and isolation layers configured to isolate the plurality of active pillars.

Figure 3:
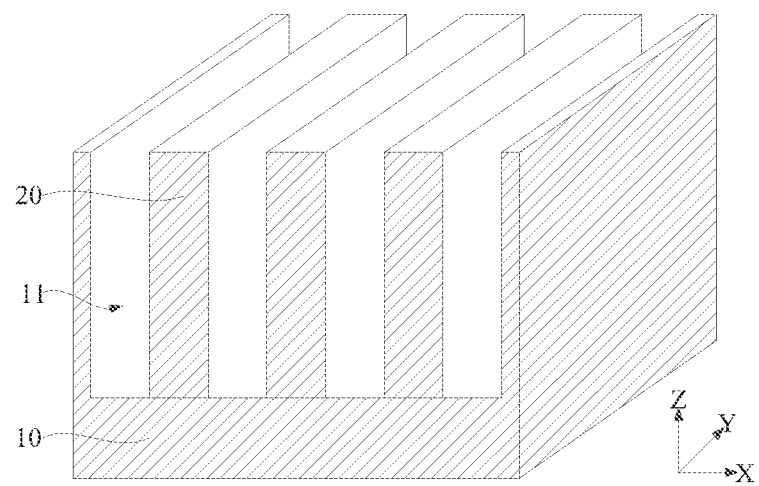
FIG. 3 is a stereo view of a first trench formed in the method for fabricating the semiconductor structure according to an embodiment of the present disclosure.

In a possible implementation, referring to FIG. 3, Step S210: forming, in the substrate, a plurality of first trenches spaced along the first direction, where the plurality of first trenches are configured to divide the substrate into a plurality of strip-shaped bodies, and the second direction intersects the first direction.

In this step, the substrate 10 may be removed by part of thickness by means of dry etching or wet etching to form a plurality of first trenches 11 in the substrate 10, where bottoms of the first trenches 11 are positioned in the substrate 10.

Exemplarily, the plurality of first trenches 11 are formed by means of a Self-Aligned Double Patterning (SADP) process or a Self-Aligned Quadruple Patterning (SAQP) process, to increase density of the first trenches 11 and ensure aspect ratio of the first trenches 11.

The plurality of first trenches 11 are arranged at intervals along the first direction and extend along the second direction to separate the substrate 10 into a plurality of strip-shaped bodies 20, and the plurality of strip-shaped bodies 20 are arranged at intervals along the first direction and extend along the second direction. The first direction intersects the second direction, for example, the first direction and the second direction are perpendicular to each other. Taking an orientation shown in FIG. 3 as an example, the first direction is an X direction in FIG. 3, and the second direction is a Y direction in FIG. 3.

Step S220: forming a first initial isolation layer in the first trench, where the first initial isolation layer fills up the first trench and cover the strip-shaped bodies.

Figure 4:
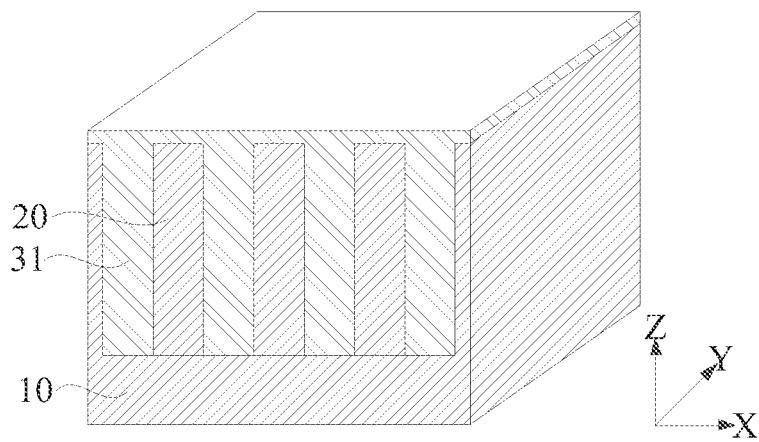
FIG. 4 is a stereo view of forming a first isolation layer in the method for fabricating the semiconductor structure according to an embodiment of the present disclosure.
Figure 5:
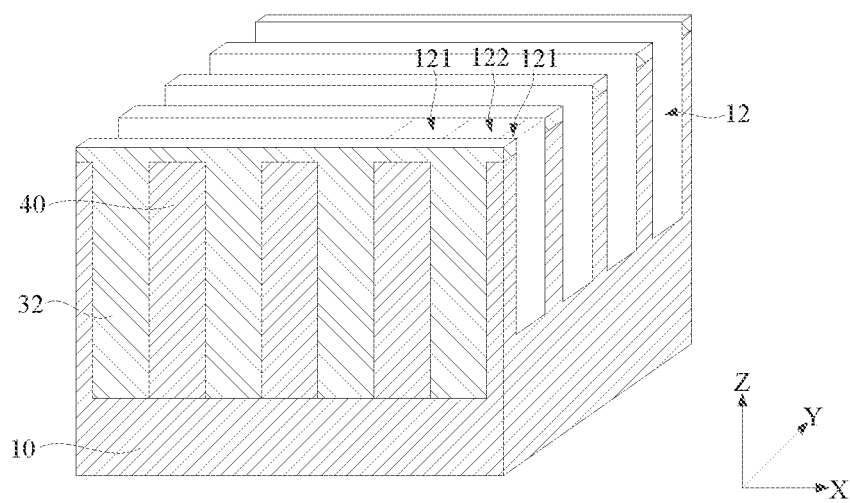
FIG. 5 is a stereo view of forming a second trench in the method for fabricating the semiconductor structure according to an embodiment of the present disclosure.
Figure 6:
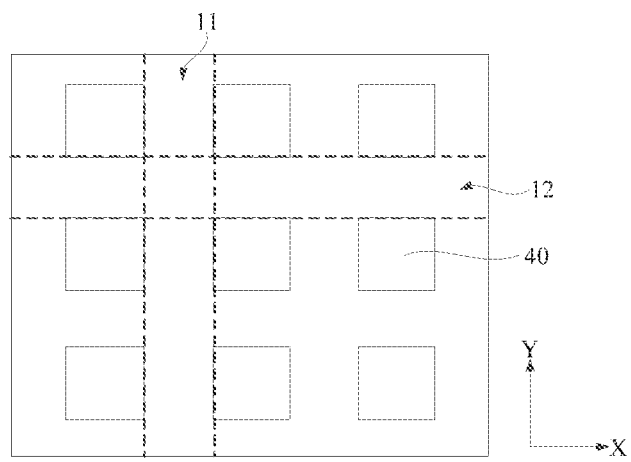
FIG. 6 is a schematic diagram I of an active pillar provided by an embodiment of the present disclosure.
Figure 7:
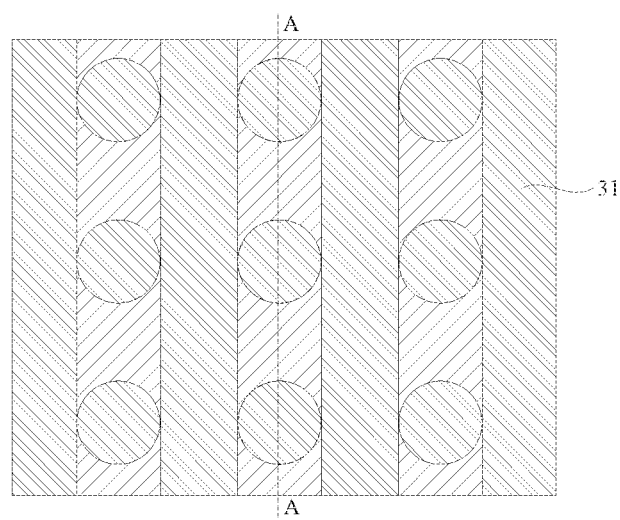
FIG. 7 is a schematic diagram II of the active pillar provided by an embodiment of the present disclosure.
Figure 8:
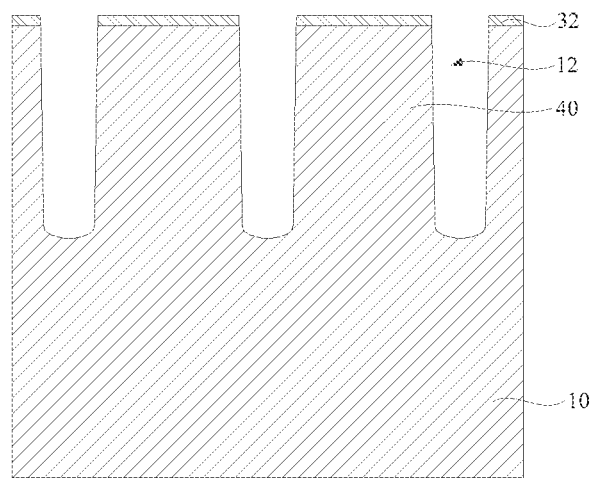
FIG. 8 is a sectional view along an A-A direction in FIG. 7.

For example, referring to FIG. 4, first initial isolation layers 31 are formed in the first trenches 11 by means of chemical vapor deposition (CVD), physical vapor deposition (PVD) or atomic layer deposition (ALD) or other processes. The first initial isolation layers 31 fill up the first trenches 11 and cover top surfaces of the strip-shaped bodies 20, to realize electrical insulation between the plurality of strip-shaped bodies 20 by means of the first initial isolation layers 31. A material of the first initial isolation layer 31 includes silicon oxide, but is not limited thereto.

It should be noted that, after the first initial isolation layers 31 are formed by means of deposition, top surfaces of the first initial isolation layers 31 may be planarized by means of chemical mechanical polishing (CMP) or other processes, such that the top surfaces of first initial isolation layers 31 are flat surfaces, which facilitates subsequent formation of other film layers, such as a mask layer, on the top surfaces of the first initial isolation layers 31.

Step S230: removing a portion of the first initial isolation layers and a portion of the strip-shaped bodies to form a plurality of second trenches spaced along the second direction, where each of the plurality of second trenches extends along the first direction, depths of the second trenches are less than depths of the first trenches, the plurality of second trenches are configured to divide the strip-shaped bodies into the plurality of active pillars, and a retained portion of the first initial isolation layers form first isolation layers.

For example, referring to FIGS. 5 to 8, a second trench 12 extends along the first direction, such that the depths of the second trenches 12 dividing the strip-shaped bodies into a plurality of active pillars 40 are smaller than the depths of the first trenches 11, and the second trenches 12 do not penetrate through the strip-shaped bodies 20 in a direction perpendicular to the substrate 10. That is, the depths of the second trenches 12 are smaller than heights of the strip-shaped bodies 20. Thus, the bottoms of the active pillars 40 positioned in the same second direction are connected together, such that bit lines are subsequently formed in a region where the bottoms of the active pillars positioned in the same second direction are connected together, and source regions or drain regions of the plurality of active pillars 40 subsequently formed have same voltage. In this way, stability of a threshold voltage of the semiconductor structure is ensured, and a floating body effect may be reduced.

To facilitate description of a shape and an arrangement position of the second trench 12, the second trench 12 may be further refined. For example, the second trench 12 includes a plurality of first sub trenches 121 and a plurality of second sub trenches 122. The plurality of first sub trenches 121 and the plurality of second sub trenches 122 are alternately and sequentially connected, where the first sub trenches 121 are formed by removing a portion of the strip-shaped bodies 20, and the second sub trenches 122 are formed by removing a portion of first initial isolation layers 31, and a retained portion of the first initial isolation layer may be denoted as first isolation layers 32.

In an embodiment, the active pillars 40 may be in various shapes. For example, referring to FIG. 6, a section parallel to the substrate 10 is taken as a cross section, and the cross section of the active pillar 40 is rectangular, such that fabrication of the active pillars 40 may be facilitated, and difficulty of fabricating the semiconductor structure is reduced.

A long side of the rectangular active pillar 40 is parallel to the first direction X, so it can be ensured that a length of a subsequently formed gate channel is increased.

For another example, the cross section of the active pillar 40 may be circular. The cylindrical active pillars 40 may be directly formed via a pattern of a mask layer or in other manners.

For example, the active pillars with the rectangular cross sections may be formed first. Next, referring to FIG. 7 and FIG. 8, the rectangular active pillars 40 may be subjected to pretreatment. The pretreatment includes oxidation treatment. Edges and corners of the active pillars 40 are passivated by means of the oxidation treatment, such that the cross section of a silicon pillar of the active pillar 40 is changed to be a circular shape from a rectangular shape. Thus, in this embodiment, the edges and corners of the active pillars 40 are passivated by means of the oxidation treatment, such that adhesive ability of the subsequent active pillars 40 may be improved to facilitate subsequently formed functional layers such as dielectric layers, word lines and bit lines to be in good connection with the active pillars 40, thereby improving the performance and yield of the semiconductor structure. In addition, a width of the gate channel formed subsequently may also be increased.

It should be noted that the oxidation treatment includes thermal oxidation treatment or steam oxidation treatment. In the oxidation treatment, the active pillars 40 exposed to outside may be subjected to thermal oxidation or steam oxidation, such that an oxide layer, such as silicon oxide, is formed on the surfaces of the active pillars 40. Next, the oxide layer may be removed by means of etching, to remove part of the active pillars 40, such that the edges and corners of the active pillars 40 are passivated.

In addition, after the first isolation layers 32 are formed, the bottoms of the active pillars 40 may be doped by means of plasma implantation or plasma doping technologies, such that the bottoms of the active pillars 40 form the source regions or drain regions. Types of the doping ions may be N-type ions or P-type ions.

Step S240: forming second isolation layers in the second trenches, where the second isolation layers and the first isolation layers form the isolation layers.

Figure 9:
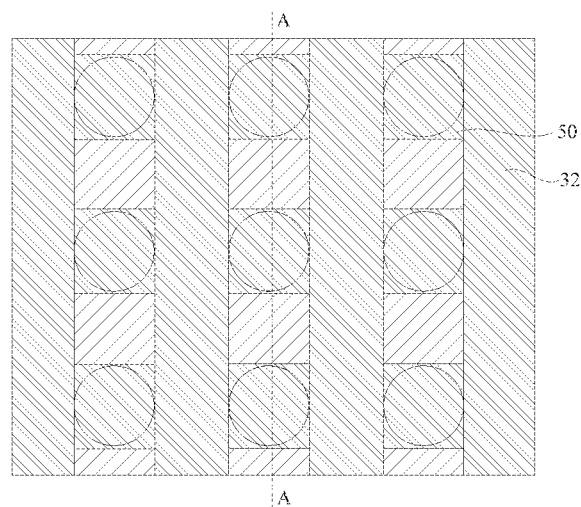
FIG. 9 is a schematic diagram of forming a protective layer in the method for fabricating the semiconductor structure according to an embodiment of the present disclosure.
Figure 10:
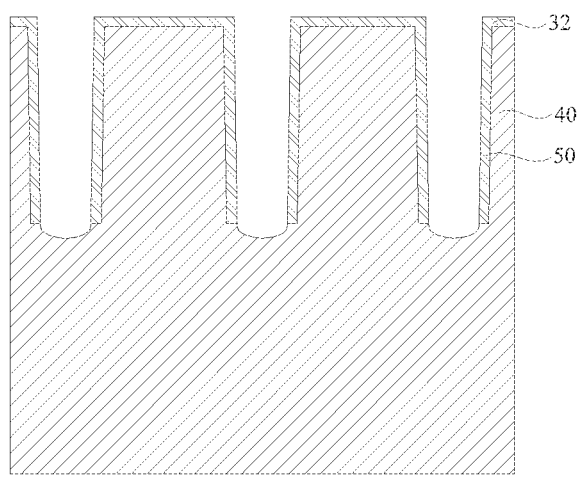
FIG. 10 is a sectional view along an A-A direction in FIG. 9.

Referring to FIG. 9 and FIG. 10, before this step, the method for fabricating the semiconductor structure further includes following steps of: forming a protective layer 50 on a side wall of the second trench 12 by means of an atomic layer deposition process, a region enclosed by the protective layer 50 exposing a bottom wall of the second trench 12, where the protective layer 50 is connected to the first isolation layer 32 positioned on the top surface of the active pillar 40. A material of the protective layer 50 includes silicon oxide, but is not limited thereto.

Figure 11:
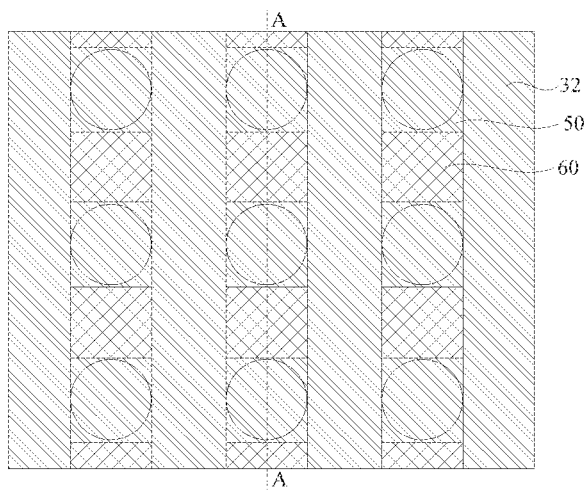
FIG. 11 is a schematic diagram of forming a bit line in the method for fabricating the semiconductor structure according to an embodiment of the present disclosure.
Figure 12:
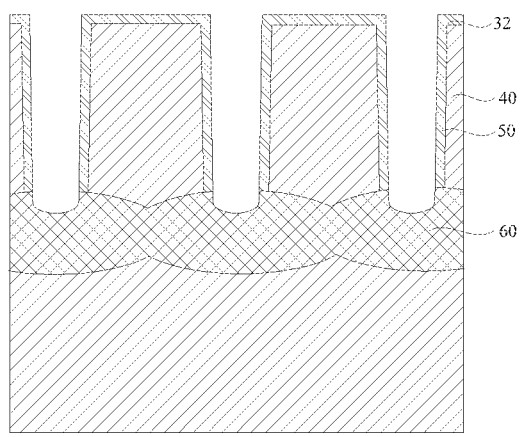
FIG. 12 is a sectional view along an A-A direction in FIG. 11.

Referring to FIG. 11 and FIG. 12, the substrate 10 exposed in the second trench 12 is siliconized to form bit lines 60 in the substrate 10 between adjacent second trenches 12, the bit lines 60 extend along the second direction Y and are connected to the source regions or drain regions of the active pillars 40.

For example, cobalt is introduced into a region surrounded by the protective layer 50 through an ion implantation process, such that the cobalt reacts with the silicon in the substrate 10 under certain conditions to form a cobalt silicide layer, which constitutes the bit lines 60.

In this embodiment, the protective layers 50 and the first isolation layers 32 are configured to protect the top surfaces and side surfaces of the active pillars 40 from causing damage to the active pillars 40 when the bit lines 60 are formed, thereby improving the performance of the semiconductor structure.

Figure 13:
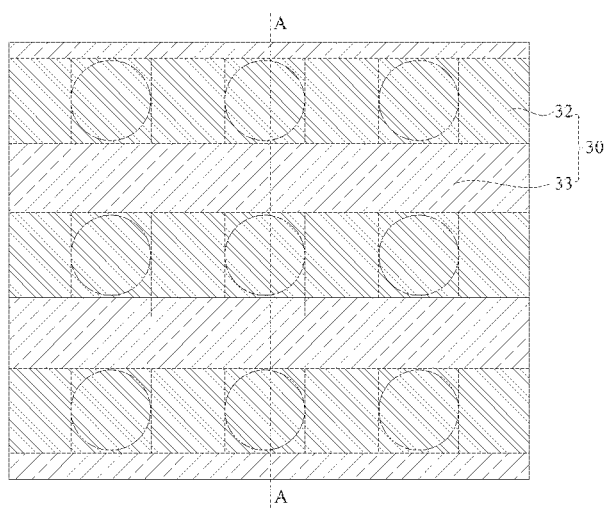
FIG. 13 is a schematic diagram of forming a second isolation layer in the method for fabricating the semiconductor structure according to an embodiment of the present disclosure.
Figure 14:
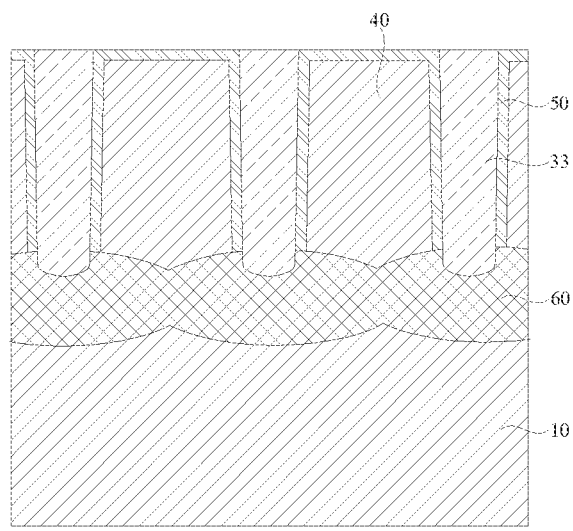
FIG. 14 is a sectional view along an A-A direction in FIG. 13.

After the bit lines 60 are formed, referring to FIG. 13 and FIG. 14, an insulating material may be deposited onto the second trenches 12 by means of a chemical vapor deposition process or a physical vapor deposition process. The insulating material fills up the second trenches 12 to form second isolation layers 33, where the second isolation layers 33 and the first isolation layers 32 form the isolation layers 30. A material of the second isolation layers 33 includes silicon nitride, but is not limited thereto.

In this embodiment, the isolation layer 30 and the protective layer 50 are employed to achieve the electrical insulation between any active pillars 40, thereby ensuring the yield of the semiconductor structure. In addition, the first isolation layers 32 may also serve as isolation structures for the bit lines 60 to realize the insulation between adjacent bit lines 60.

Step S300: forming, in the active pillars and the isolation layers, a plurality of word line trenches extending along the first direction, where each of the plurality of word line trenches is configured to communicate with the plurality of active pillars positioned in the same first direction, and each of the plurality of word line trenches includes a first word line trench and a second word line trench spaced along the second direction.

Figure 15:
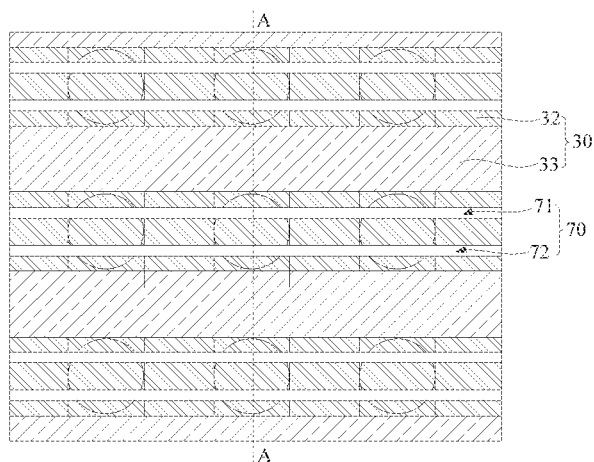
FIG. 15 is a schematic diagram of forming a word line trench in the method for fabricating the semiconductor structure according to an embodiment of the present disclosure.
Figure 16:
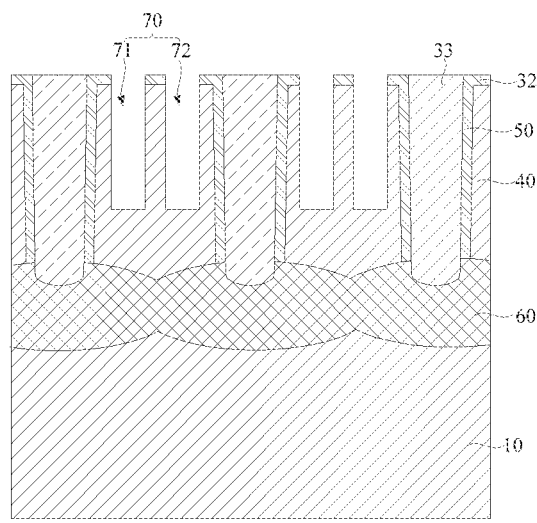
FIG. 16 is a sectional view along an A-A direction in FIG. 15.

Exemplarily, referring to FIG. 15 and FIG. 16, a mask layer (not shown in the figure) with a mask pattern may be formed on the isolation layer 30, and the isolation layers 30 and the active pillars 40 may be etched by a portion of thickness using the mask layer as a mask, to form word line trenches 70 extending along the first direction X. Each of the word line trenches 70 includes a first word line trench 71 and a second word line trench 72 arranged at intervals in parallel to each other.

Bottoms of the word line trenches 70 are higher than bottoms of the active pillars 40. That is, the bottoms of the word line trenches 70 are higher than top surfaces of the source regions or drain regions of the active pillars 40. Thus, the subsequently formed word lines may be prevented from being electrically connected to the source regions or drain regions of the active pillars 40, such that interconnection between the word lines and the bit lines 60 may be avoided, and thus the yield of the semiconductor structure is increased.

In this example, widths of the first word line trenches 71 and widths of the second word line trenches 72 may be the same or may be different.

Step S400: forming a first word line in the first word line trench and a second word line in the second word line trench, where in the second direction, opposite surfaces of the first word line form a first gate channel together with the active pillars, opposite surfaces of the second word line form a second gate channel together with the active pillars, sum of a width of the first gate channel along the first direction and a width of the second gate channel along the first direction is greater than a perimeter of the given active pillar, and the first direction intersects with the second direction.

Figure 17:
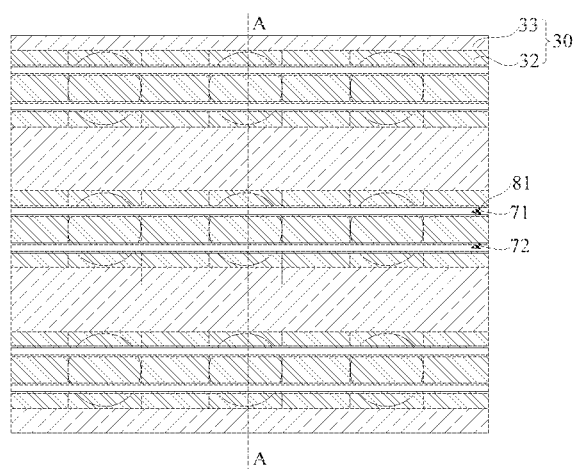
FIG. 17 is a schematic diagram of forming an initial gate oxide layer in the method for fabricating the semiconductor structure according to an embodiment of the present disclosure.
Figure 18:
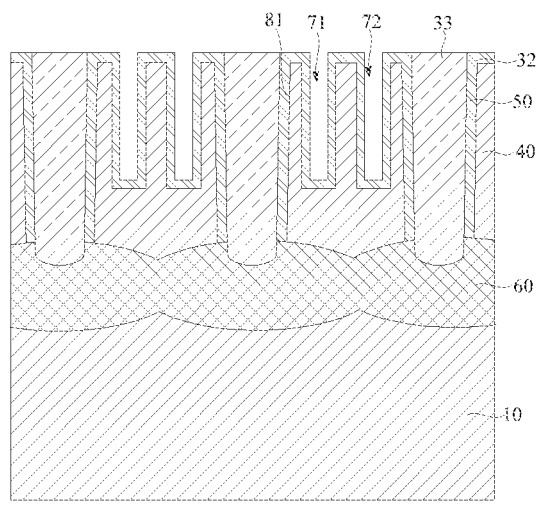
FIG. 18 is a sectional view along an A-A direction in FIG. 17.

For example, referring to FIG. 17 and FIG. 18, an initial gate oxide layer 81 is formed on an inner wall of the word line trench 70 by means of an atomic layer deposition process. For example, the initial gate oxide layer 81 covers an inner wall of the first word line trench 71 and an inner wall of the second word line trench 72. The initial gate oxide layer 81 may also cover the top surface of the isolation layer 30. The initial gate oxide layer 81, such as one or more of hafnium oxide, hafnium silicate oxynitride, aluminum oxide, zirconium oxide, or hafnium zirconate, has a larger dielectric constant, such that the performance of the semiconductor structure may be improved. In other exemplary embodiments, the initial gate oxide layer may also be formed by oxidizing the substrate exposed to the first word line trench and the second trench. For example, the oxidization process includes an in-situ stream generation (ISSG) process and a thermal oxidation process.

Figure 19:
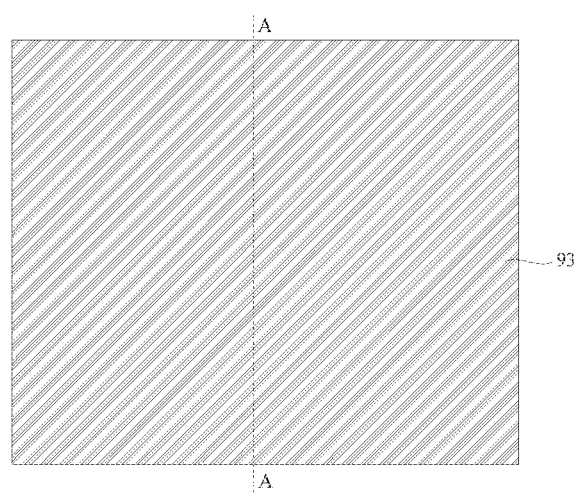
FIG. 19 is a schematic diagram of forming a first conductive layer in the method for fabricating the semiconductor structure according to an embodiment of the present disclosure.
Figure 20:
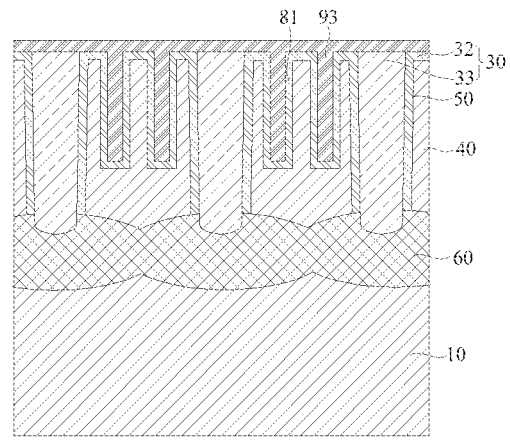
FIG. 20 is a sectional view along an A-A direction in FIG. 19.

Next, referring to FIGS. 19 and 20, a first conductive layer 93 is formed, where the first conductive layer 93 fills up a region enclosed by the initial gate oxide layer 81 and covers the top surface of the isolation layer 30.

Figure 21:
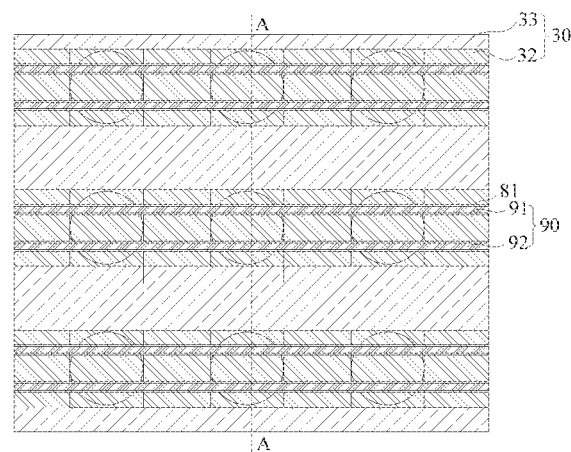
FIG. 21 is a schematic diagram of forming a first word line and a second word line in the method for fabricating the semiconductor structure according to an embodiment of the present disclosure.
Figure 22:
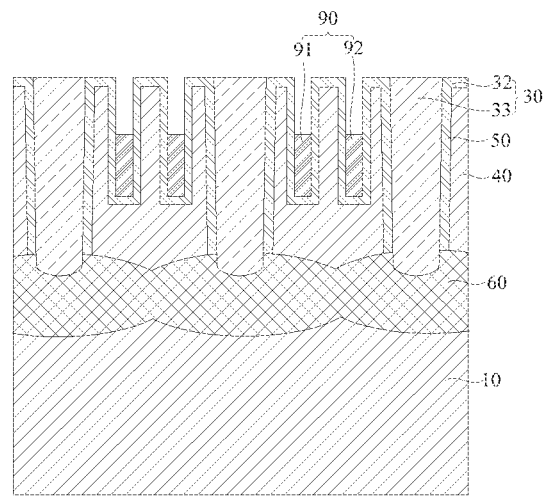
FIG. 22 is a sectional view along an A-A direction in FIG. 21.

Next, referring to FIGS. 21 and 22, the first conductive layer 93 is removed by a portion of thickness by means of dry etching or wet etching. That is, a portion of the first conductive layer 93 positioned on the top surface of the isolation layer 30 and a portion of the first conductive layer 93 positioned in the first word line trench 71 and the second word line trench 72 are removed, such that a portion of the first conductive layer 93 retained in the first word line trench 71 forms a first word line 91, and a portion of the first conductive layer 93 retained in the second word line trench 72 forms a second word line 92, where the first word line 91 and the second word line 92 form a word line 90. A cosine value of an angle formed between a connection line between a point of intersection between the first word line 91 and the active pillar 40 and a center of the active pillar 40 and the first direction X is greater than $\sqrt{3}/2$.

In the first direction, opposite surfaces of the first word line 91 forms a first gate channel together with the active pillar 40, opposite surfaces of the second word line 92 forms a second gate channel together with the active pillar 40, and sum of a width of the first gate channel along the first direction X and a width of the second gate channel along the first direction X is greater than a perimeter of the active pillar 40. In this way, the width of the gate channel is increased, power consumption of a transistor is reduced, and performance of the semiconductor structure is improved.

Figure 23:
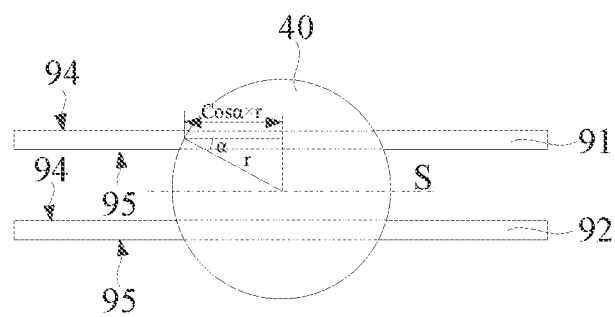
FIG. 23 is a schematic diagram of the active pillar, the first word line, and the second word line according to an embodiment of the present disclosure.

In a possible implementation, referring to FIG. 23, the section parallel to the substrate is taken as the cross section, and the cross section of the active pillar 40 is circular. The first word line 91 and the second word line 92 are symmetrically arranged with respect to the center of the active pillar 40. That is, the first word line 91 and the second word line 92 are symmetrically arranged with respect to a central line S in FIG. 23.

In the second direction, the first word line 91 and the second word line 92 each have opposite surfaces. For example, there is a first surface 94 and a second surface 95 disposed opposite to each other, and a gate channel is provided between the first surface 94 and the active pillar 40.

The gate channel formed between the first surface 94 or second surface 95 of the first word line 91 and the active pillar 40 is denoted as the first gate channel, and the gate channel formed between the first surface 94 or second surface 95 of the second word line 92 and the active pillar 40 is denoted as the second gate channel.

A point of intersection between the first word line 91 and the active pillar 40 is connected to a center of circle of the active pillar 40 to constitute a connection line, an angle α formed between the connection line and the first direction is greater than 0° and less than or equal to 30°. According to the Pythagorean theorem, the width of the first gate channel in the first direction X is approximately equal to 4×cos α×r; and the width of the second gate channel in the first direction X is approximately equal to 4×cos α×r. Therefore, the width of the gate channel in the first direction X is equal to the sum of the width of the first gate channel and the width of the second gate channel, which is approximately equal to 8×cos α×r.

For example, the point of intersection between the first word line 91 and the active pillar 40 is connected to the center of circle of the active pillar 40 to constitute a connection line, the angle formed between the connection line and the first direction is equal to 30°. Correspondingly, the width of the gate channel is approximately equal to $4\sqrt{3}r$, that is, the width of the gate channel is approximately equal to 6.93r. Compared with the related technologies where the width of the gate channel is 2πr=6.28r, the width of the gate channel is increased, the power consumption of the transistor is reduced, and the performance of the semiconductor structure is improved.

Because a cosine value of an acute angle increases with decrease of the angle, the width of the gate channel in this embodiment is greater than the width of the gate channel in the related technologies, to achieve the objective of reducing the power consumption of the transistor and improving the performance of the semiconductor structure.

In another possible implementation, the section parallel to the substrate 10 is taken as the cross section, the cross section of the active pillar 40 is rectangular, and a long side of the active pillar 40 is parallel to the first direction. For the convenience of subsequent description, the long side of the active pillar 40 may be denoted as L1, and a short side of the active pillar 40 may be denoted as L2. If the word line is arranged according to the related technologies, the width of the gate channel is equal to 2L1+2L2.

In the present disclosure, the width of the first gate channel and the width of the second gate channel are both equal to 2L1, and further, the width of the gate channel is equal to 4L1, which is greater than the width of the gate channel in the related technologies.

In a possible implementation, after removing the first conductive layer by the portion of thickness, the method for fabricating the semiconductor structure further includes following steps.

Figure 24:
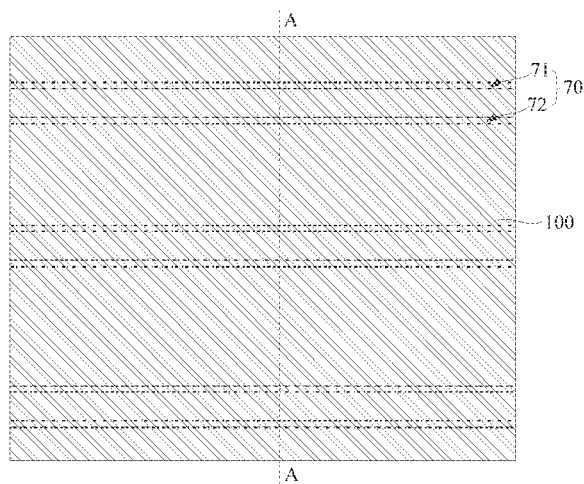
FIG. 24 is a schematic diagram of forming a first insulating layer in the method for fabricating the semiconductor structure according to an embodiment of the present disclosure.
Figure 25:
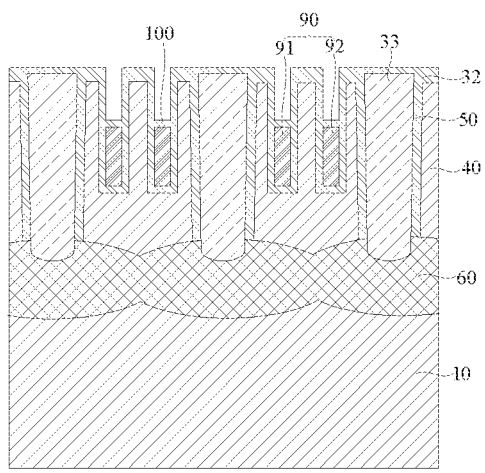
FIG. 25 is a sectional view along an A-A direction in FIG. 24.

Referring to FIG. 24 and FIG. 25, a first insulating layer 100 is formed. The first insulating layer 100 covers the top surfaces of the first word line 91 and the second word line 92 and is connected to the initial gate oxide layer 81 to realize the insulation between the first word line 91, the second word line 92 and semiconductor devices formed subsequently. A material of the first insulating layer 100 includes silicon oxide, but is not limited thereto.

Referring to FIG. 26 to FIG. 34, a portion of the initial gate oxide layer 81 positioned on a side wall of the first word line trench 71 and on a side wall of the second word line trench 72 is removed, a portion of the initial gate oxide layer retained forms a gate oxide layer 80, and a top surface of the gate oxide layer 80 is flush with a top surface of the first insulating layer 100.

Figure 26:
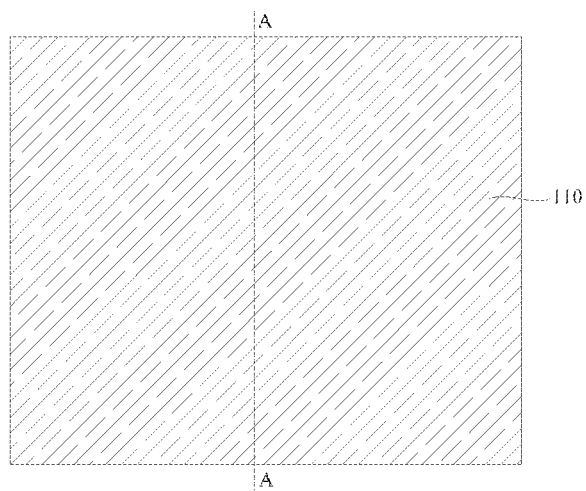
FIG. 26 is a schematic diagram of forming a first mask layer in the method for fabricating the semiconductor structure according to an embodiment of the present disclosure.
Figure 27:
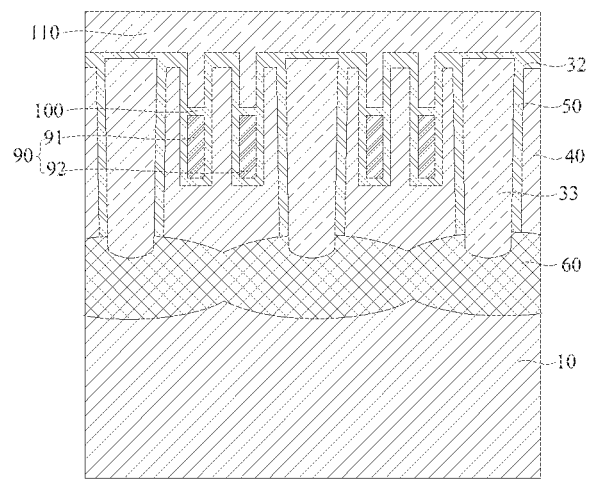
FIG. 27 is a sectional view along an A-A direction in FIG. 26.

Exemplarily, referring to FIG. 26 and FIG. 27, a first mask layer 110 is formed on the first insulating layer 100, and a top surface of the first mask layer 110 is higher than the top surface of the active pillar 40. The first mask layer 110 may be a photoresist layer.

Figure 28:
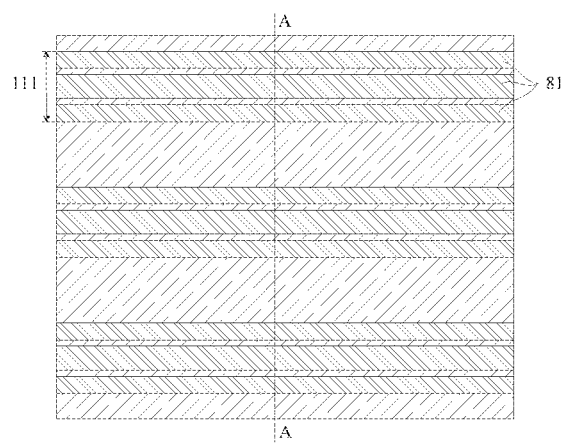
FIG. 28 is a schematic diagram of patterning the first mask layer in the method for fabricating the semiconductor structure according to an embodiment of the present disclosure.
Figure 29:
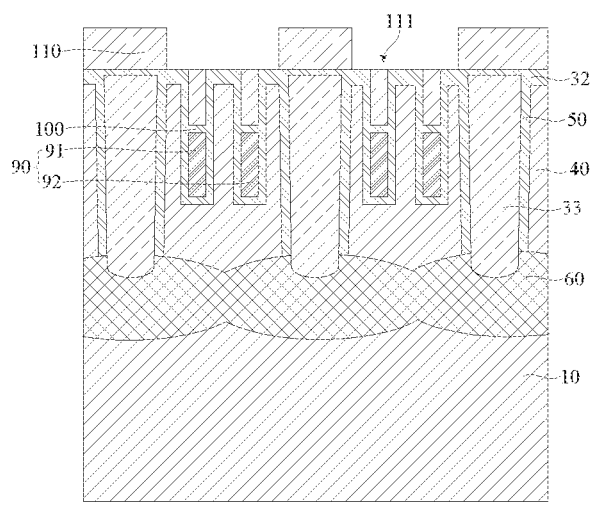
FIG. 29 is a sectional view along an A-A direction in FIG. 28.

Referring to FIG. 28 and FIG. 29, the first mask layer 110 is patterned to form a plurality of mask openings 111 in the first mask layer 110, the plurality of mask openings 111 are spaced along the second direction Y, and each of the mask openings 111 extends along the first direction X, where the mask openings 111 expose the initial gate oxide layers 81.

Figure 30:
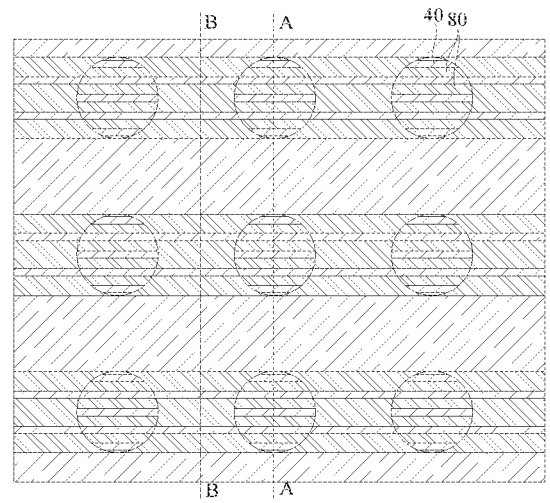
FIG. 30 is a schematic diagram of forming the gate oxide layer in the method for fabricating the semiconductor structure according to an embodiment of the present disclosure.
Figure 31:
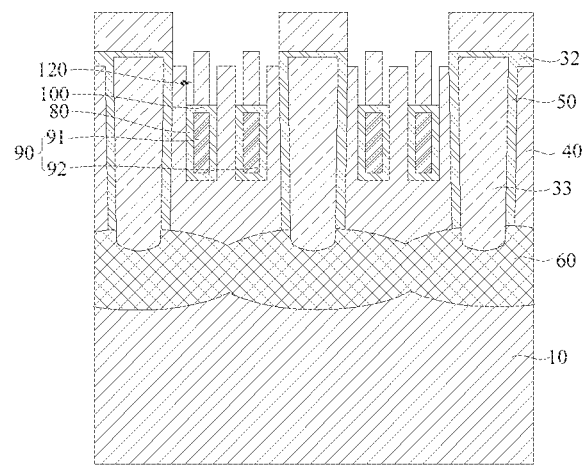
FIG. 31 is a sectional view along an A-A direction in FIG. 30.

Referring to FIGS. 30 to 31, the initial gate oxide layers 81 exposed in the mask openings 111 are removed, and remaining part of the initial gate oxide layers 81 constitute the gate oxide layers 80.

Figure 32:
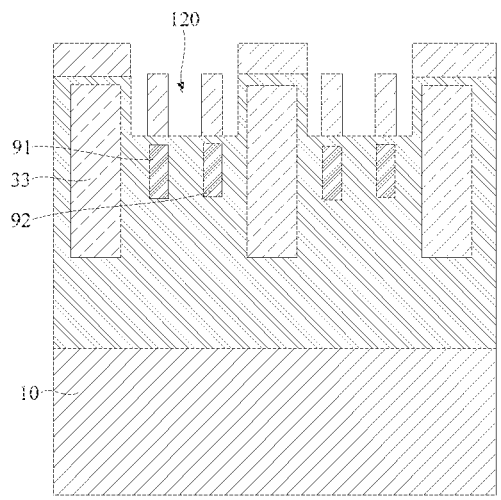
FIG. 32 is a sectional view along a B-B direction in FIG. 30.

Referring to FIG. 32, while removing part of the initial gate oxide layers 81 in the first word line trench 71 and the second word line trench 72, part of the isolation layers 30 are also removed, such that a filling region 120 is formed between a remaining part of the isolation layers 30 and the first insulating layer 100.

Figure 33:
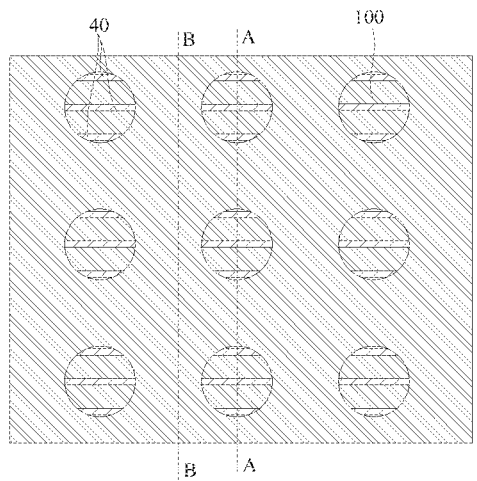
FIG. 33 is a schematic diagram of removing the first mask layer in the method for fabricating the semiconductor structure according to an embodiment of the present disclosure.
Figure 34:
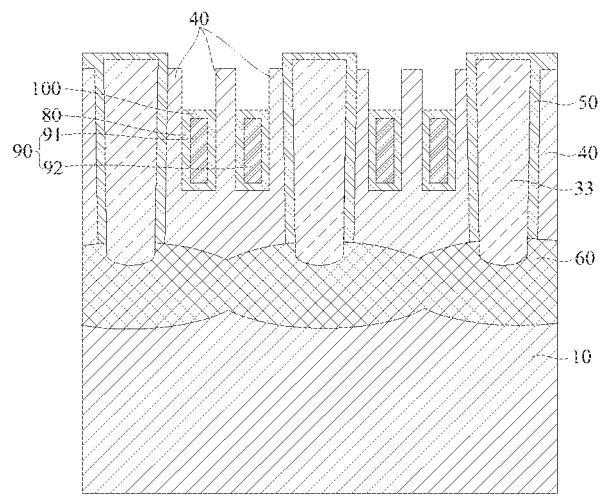
FIG. 34 is a sectional view along an A-A direction in FIG. 33.
Figure 35:
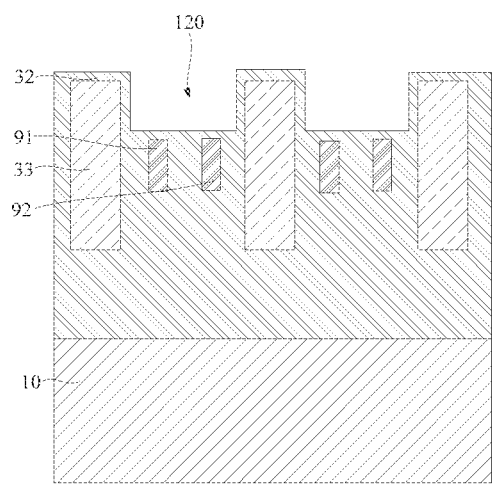
FIG. 35 is a sectional view along a B-B direction in FIG. 33.

Next, referring to FIGS. 33 to 35, the first mask layers 110 are removed.

Figure 36:
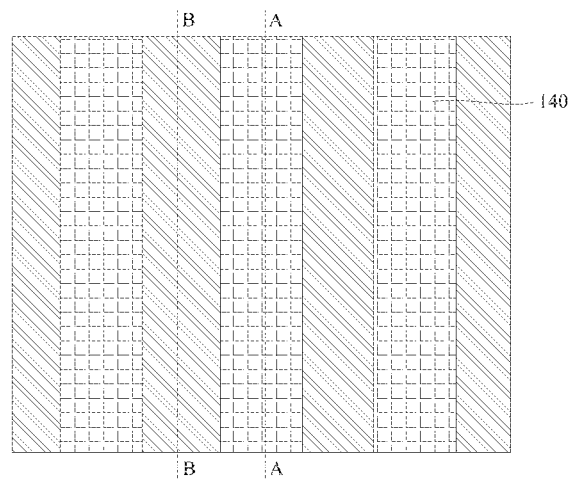
FIG. 36 is a schematic diagram of forming a second mask layer in the method for fabricating the semiconductor structure according to an embodiment of the present disclosure.
Figure 37:
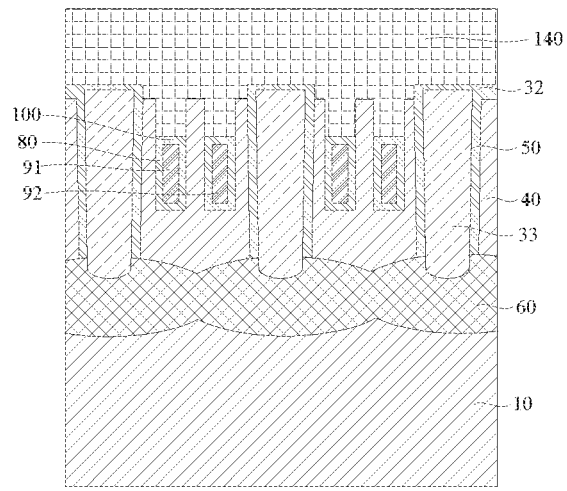
FIG. 37 is a sectional view along an A-A direction in FIG. 36.
Figure 38:
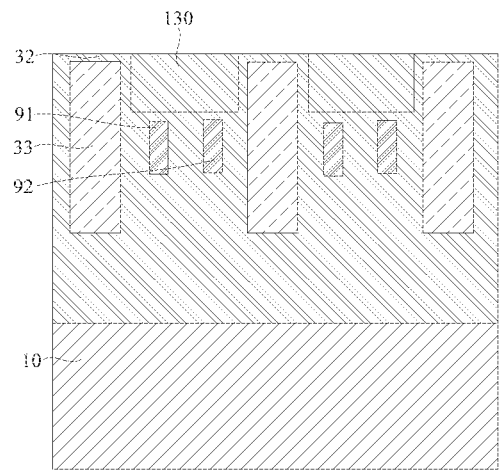
FIG. 38 is a sectional view along the B-B direction after forming a second insulating layer in the method for fabricating the semiconductor structure according to an embodiment of the present disclosure.

After the first mask layers 110 are removed, referring to FIG. 36 to FIG. 38, second insulating layers 130 are formed, the second insulating layers 130 are connected to the isolation layers 30, and top surfaces of the second insulating layers 130 are flush with top surfaces of the first isolation layers 32. The second insulating layers 130 and the isolation layers 30 are configured to achieve electrical insulation between the plurality of active pillars 40. That is, the second insulating layers 130 and the isolation layers 30 are configured to achieve electrical isolation between tops of the plurality of active pillars 40.

Exemplarily, referring to FIG. 36 and FIG. 37, a second mask layer 140 having an opening is formed, and the opening is configured to expose the filling region 120, and rest of positions are shielded. The second mask layer 140 may be a photoresist layer.

Next, referring to FIG. 38, an insulating material is deposited in the filling region 120 by means of a deposition process, and is planarized by means of a process such as chemical mechanical polishing (CMP) to form the second insulating layers 130. The top surfaces of the second insulating layers 130 are flush with the top surfaces of the first isolation layers 32, and a material of the second insulating layers 130 includes silicon oxide, but is not limited thereto.

Finally, the second mask layer is removed by means of wet etching.

In a possible implementation, after the forming the second insulating layer, the method for fabricating the semiconductor structure further includes following steps.

Referring to FIG. 39 to FIG. 48, a capacitor contact structure 150 is formed, where a portion of the capacitor contact structure 150 is positioned in a region enclosed by the first insulating layer 100 and the active pillar 40, the capacitor contact structure 150 is connected to the source region or the drain region of the active pillar 40, and a connection end between the capacitor contact structure 150 and the active pillar 40 is not same as a connection end between the bit line 60 and the active pillar 40.

Figure 39:
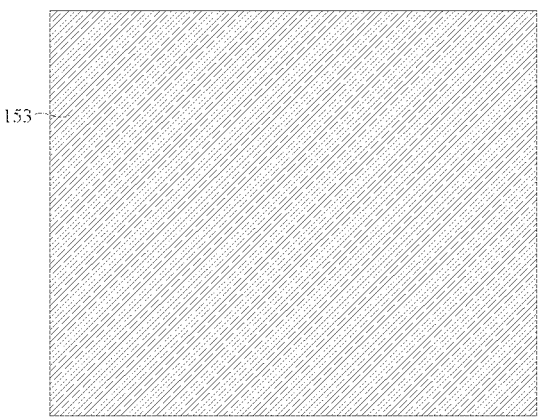
FIG. 39 is a schematic diagram of forming a polysilicon layer in the method for fabricating the semiconductor structure according to an embodiment of the present disclosure.
Figure 40:
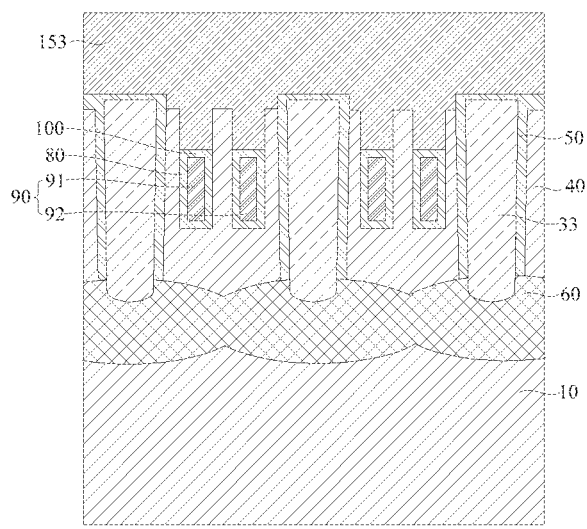
FIG. 40 is a sectional view along an A-A direction in FIG. 39.

Exemplarily, referring to FIG. 39 and FIG. 40, polysilicon layers 153 are deposited in the region surrounded by the first insulating layers 100 and the active pillars 40, and the polysilicon layers 153 extend out of this region and cover the top surfaces of the first isolation layers 32.

Figure 41:
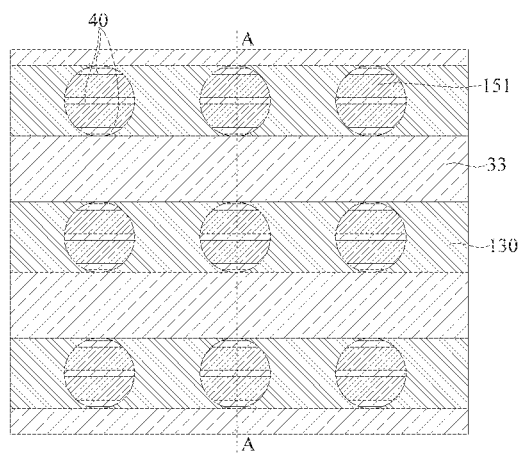
FIG. 41 is a schematic diagram of forming a connection pad in the method for fabricating the semiconductor structure according to an embodiment of the present disclosure.
Figure 42:
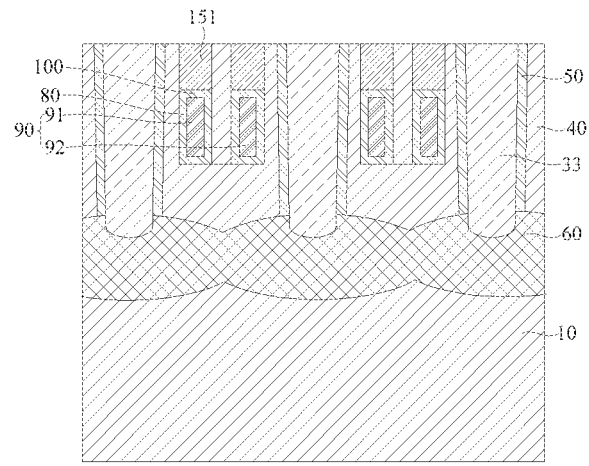
FIG. 42 is a sectional view along an A-A direction in FIG. 41.

Next, referring to FIG. 41 and FIG. 42, part of the polysilicon layers 153 and part of the isolation layers 30 are removed by means of chemical mechanical polishing (CMP), such that a remaining part of the polysilicon layers 153 form connection pads 151, and top surfaces of the connection pads 151 are flush with the top surfaces of the active pillars 40.

Figure 43:
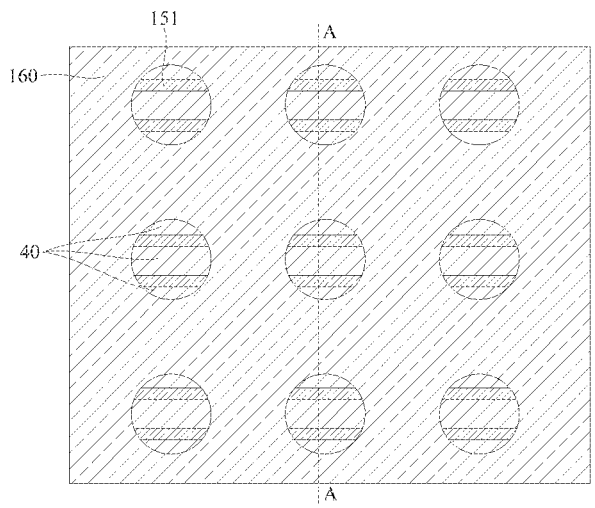
FIG. 43 is a schematic diagram of forming a third insulating layer in the method for fabricating the semiconductor structure according to an embodiment of the present disclosure.
Figure 44:
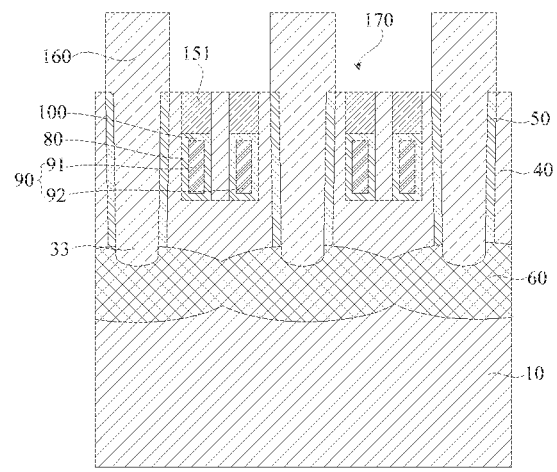
FIG. 44 is a sectional view along an A-A direction in FIG. 43.

Referring to FIGS. 43 and 44, third insulating layers 160 are formed on the isolation layers 30, contact holes 170 are formed in the third insulating layers 160, and the contact holes 170 expose the top surfaces of the active pillars 40 and the top surfaces of the connection pads 151. That is, the third insulating layers 160 may be formed on the second isolation layers 33.

Figure 47:
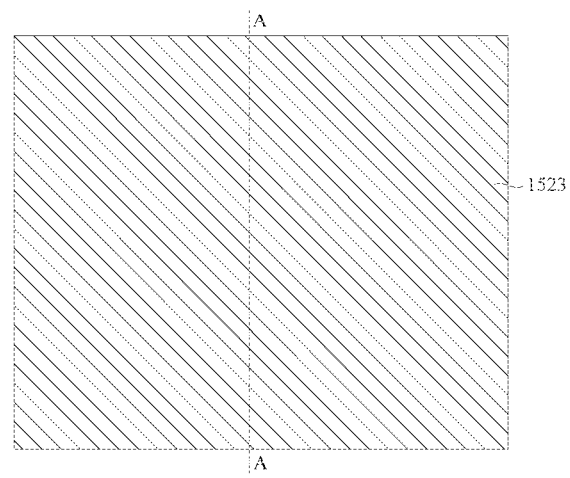
FIG. 47 is a schematic diagram of forming an initial barrier layer and a third initial conductive layer in the method for fabricating the semiconductor structure according to an embodiment of the present disclosure.
Figure 48:
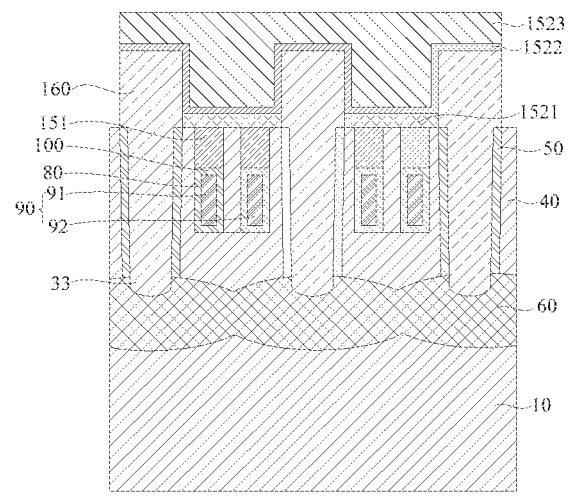
FIG. 48 is a sectional view along the direction A-A in FIG. 47.

Next, conductive plugs 152 are formed in the contact holes 170, and the conductive plugs 152 and the connection pads 151 form the capacitor contact structures 150, and reference is made to FIG. 47 and FIG. 48 for the capacitor contact structures 150.

Figure 45:
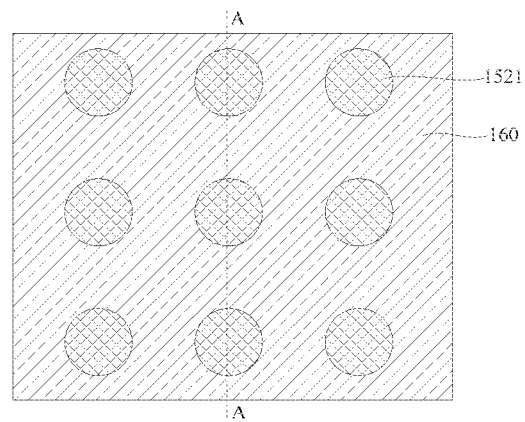
FIG. 45 is a schematic diagram of forming a second conductive layer in the method for fabricating the semiconductor structure according to an embodiment of the present disclosure.
Figure 46:
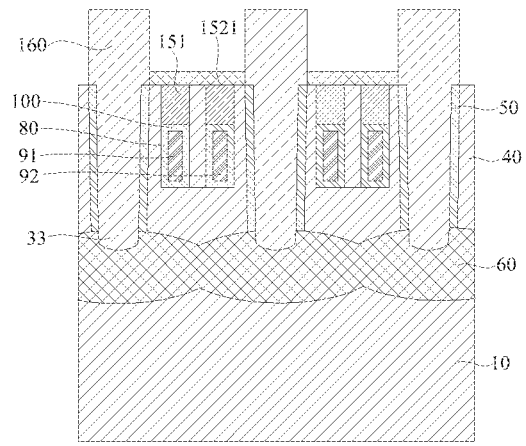
FIG. 46 is a sectional view along an A-A direction in FIG. 45.

For example, referring to FIG. 45 and FIG. 46, a second conductive layer 1521 is formed at the bottom of the contact hole 170 by means of a deposition process, and a top surface of the second conductive layer 1521 is lower than that of the third insulating layer 160, where a material of the second conductive layer 1521 includes polysilicon.

Next, referring to FIG. 47 and FIG. 48, an initial barrier layer 1522 and a third initial conductive layer 1523 are stacked on the second conductive layer 1521 and a side wall of the contact hole 170, and the third initial conductive layer 1523 fills up a region enclosed by the initial barrier layer 1522.

Figure 49:
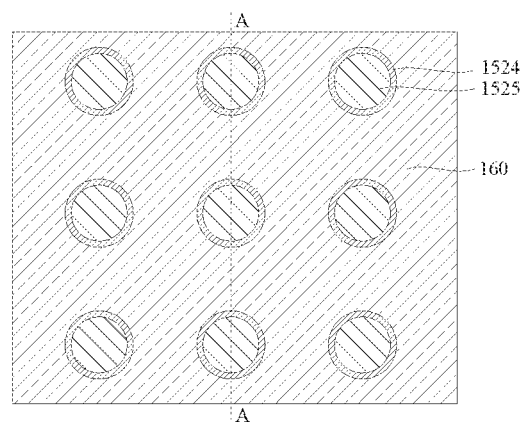
FIG. 49 is a schematic diagram of forming a conductive plug in the method for fabricating the semiconductor structure according to an embodiment of the present disclosure.
Figure 50:
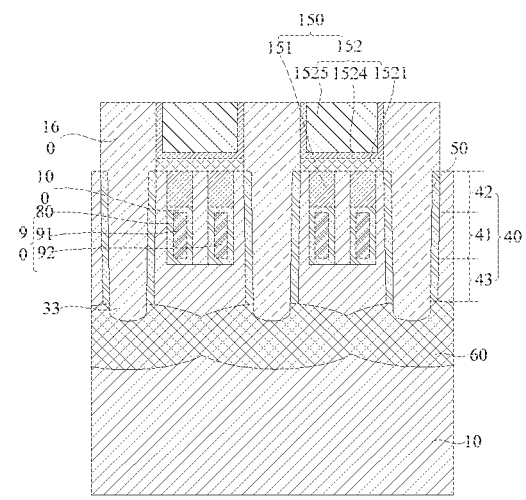
FIG. 50 is a sectional view along an A-A direction in FIG. 49.

Next, referring to FIG. 49 and FIG. 50, the initial barrier layer 1522 and the third initial conductive layer 1523 are planarized, such that retained part of the initial barrier layer 1522 constitutes a barrier layer 1524, and retained part of the third initial conductive layer 1523 constitutes the third initial conductive layer 1524, such that the second conductive layer 1521, the barrier layer 1524 and the third conductive layer 1525 constitute the conductive plug 152, and the top surface of the conductive plug 152 is flush with that of the third insulating layer 160.

In this embodiment, the arrangement of the connection pads 151 can facilitate the electrical connection between the conductive plugs 152 and the tops of the active pillars 40, meanwhile, a contact area between the connection pads 151 and the active pillars 40 can be increased, such that electrical properties of the capacitor contact structure 150 and the active pillars 40 are further improved, thereby improving the electrical properties between the capacitors formed subsequently and the active pillars 40.

In addition, the conductive plug 152 includes the barrier layer 1524. The barrier layer 1524 not only has electrical conductivity, but also can prevent the conductive material in the third conductive layer 1525 from diffusing into the third insulating layer 160, such that the electrical conductivity of the conductive plug 152 can be ensured.

Referring to FIG. 49 and FIG. 50, an embodiment of the present disclosure further provides a semiconductor structure, which is fabricated by the method in the abovementioned embodiments. The semiconductor structure includes a substrate 10, a plurality of active pillars 40, an isolation layer 30, and the plurality of word lines 90.

The plurality of active pillars 40 are arranged at intervals on the substrate 10, and the isolation layer 30 is arranged between the plurality of active pillars 40 to isolate the plurality of active pillars 40.

The plurality of word lines 90 are arranged at intervals along the second direction, and a portion of each word line 90 is embedded in the active pillar 40 and is communicated with all the active pillars 40 positioned in the same first direction X. Each of the word lines 90 includes a first word line 91 and a second word line 92 extending along the first direction X and arranged at intervals, a first gate channel is formed between the first word line 91 and the active pillar 40, a second gate channel is formed between the second word line 92 and the active pillar 40, sum of the width of the first gate channel along the first direction X and the width of the second gate channel along the first direction X is greater than the perimeter of the active pillar 40. In this way, the width of the gate channel can be increased, the power consumption of the transistor can be reduced, and the performance of the semiconductor structure can be improved.

In a possible implementation, each of the active pillars 40 includes a channel region 41 and a source region 42 and a drain region 43 positioned on two sides of the channel region 41, and the first word line 91 and the second word line 92 are both opposite to at least a portion of the channel region 41. That is, the first word line 91 and the second word line 92 are both connected to the channel region 41 to apply a voltage to the channel region 41.

The semiconductor structure further includes bit lines 60 positioned in the substrate 10 and extending along the second direction, and the bit lines 60 are connected to one of the source region 42 and the drain region 43.

The semiconductor structure also includes a capacitor contact structure 150, and the capacitor contact structure 150 is connected to other one of the source region 42 and the drain region 43. In one example, the bit line 60 is connected to the drain region 43, and correspondingly, the capacitor contact structure 150 is connected to the source region 42. In another example, the bit line is connected to the source region, and correspondingly, the capacitor contact structure is connected to the drain region.

The capacitor contact structure 150 includes a connection pad 151 and a conductive plug 152. The connection pad 151 is positioned above the word line 90 and is embedded in the active pillar 40. The conductive plug 152 is disposed on the connection pad 151 and is in electrical contact with the connection pad 151.

In this embodiment, the arrangement of the connection pads 151 can facilitate the electrical connection between the conductive plugs 152 and the tops of the active pillars 40, meanwhile, a contact area between the connection pads 151 and the active pillars 40 can be increased, such that electrical properties of the capacitor contact structure 150 and the active pillars 40 are further improved, thereby improving the electrical properties between the capacitors formed subsequently and the active pillars 40.

The embodiments or the implementations in this specification are described in a progressive manner. Each of the embodiments is focused on difference from other embodiments, and cross reference is available for identical or similar parts among different embodiments.

In the descriptions of this specification, descriptions of reference terms "one embodiment", "some embodiments", "an exemplary embodiment", "an example", "one example", or "some examples" are intended to indicate that features, structures, materials, or characteristics described with reference to the embodiment or example are included in at least one embodiment or example of the present disclosure.

The schematic representation of the above terms throughout this specification does not necessarily refer to the same embodiment or example. Furthermore, the features, structures, materials, or characteristics set forth may be combined in any suitable manner in one or more embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:

providing a substrate;

forming, in the substrate, a plurality of active pillars arranged at intervals and isolation layers configured to isolate the plurality of active pillars;

forming, in a given one of the plurality of active pillars and a given one of the isolation layers, a plurality of word line trenches extending along a first direction, each of the plurality of word line trenches being configured to communicate with the plurality of active pillars positioned in the same first direction, and each of the plurality of word line trenches comprising a first word line trench and a second word line trench spaced along a second direction; and forming a first word line in the first word line trench and a second word line in the second word line trench, in the second direction, opposite surfaces of the first word line forming a first gate channel together with the given active pillar, opposite surfaces of the second word line forming a second gate channel together with the given active pillar, sum of a width of the first gate channel along the first direction and a width of the second gate channel along the first direction being greater than a perimeter of the given active pillar, and the first direction intersecting with the second direction.

2. The method for fabricating the semiconductor structure according to claim 1, wherein a section parallel to the substrate is taken as a cross section, the cross section of the given active pillar being circular; and the first word line and the second word line are symmetrically arranged with respect to a center of the given active pillar, wherein a point of intersection between the first word line and the given active pillar is connected to a center of circle of the given active pillar to constitute a connection line, an angle formed between the connection line and the first direction being greater than 0° and less than or equal to 30°.

3. The method for fabricating the semiconductor structure according to claim 1, wherein a bottom of the given word line trench is higher than a bottom of the given active pillar.

4. The method for fabricating the semiconductor structure according to claim 1, wherein the forming, in the substrate, the plurality of active pillars arranged at intervals and the isolation layers configured to isolate the plurality of active pillars comprises:

forming, in the substrate, a plurality of first trenches spaced along the first direction, each of the plurality of first trenches extending along the second direction, and the plurality of first trenches being configured to divide the substrate into a plurality of strip-shaped bodies;

forming a first initial isolation layer in a given one of the plurality of first trenches, the first initial isolation layer filling up the given first trench and covering a given one of the plurality of strip-shaped bodies;

removing a portion of the first initial isolation layer and a portion of the given strip-shaped body to form a plurality of second trenches spaced along the second direction, each of the plurality of second trenches extending along the first direction, wherein a depth of a given one of the plurality of second trenches is less than a depth of the given first trench, the plurality of second trenches being configured to divide the given strip-shaped body into the plurality of active pillars, and a retained portion of the first initial isolation layer forming a first isolation layer; and forming a second isolation layer in the given second trench, the second isolation layer and the first isolation layer forming the given isolation layer.

5. The method for fabricating the semiconductor structure according to claim 4, wherein after removing the portion of the first initial isolation layer and the portion of the given strip-shaped body to form the second trenches extending along the first direction, and before forming the second isolation layer in the given second trench, the method comprises:

forming a protective layer on a side wall of the given second trench, a region enclosed by the protective layer exposing a bottom wall of the given second trench, wherein the protective layer is connected to the first isolation layer positioned on a top surface of the given active pillar; and siliconizing the substrate exposed in the given second trench to form a bit line in the substrate between adjacent two of the second trenches, the bit line extending along the second direction and being connected to a source region or a drain region of the given active pillar.

6. The method for fabricating the semiconductor structure according to claim 1, wherein the forming the first word line in the first word line trench comprises:

forming an initial gate oxide layer covering an inner wall of the first word line trench and an inner wall of the second word line trench;

forming a first conductive layer filling up a region enclosed by the initial gate oxide layer; and removing the first conductive layer by a portion of thickness, a portion of the first conductive layer retained in the first word line trench forming the first word line, and a portion of the first conductive layer retained in the second word line trench forming the second word line.

7. The method for fabricating the semiconductor structure according to claim 6, wherein after removing the first conductive layer by the portion of thickness, the method further comprises:

forming a first insulating layer covering a top surface of the first word line and a top surface of the second word line, the first insulating layer being connected to the initial gate oxide layer; and removing a portion of the initial gate oxide layer positioned on a side wall of the first word line trench and a side wall of the second word line trench, and forming a filling region, wherein a portion of the initial gate oxide layer retained on the side wall of the first word line trench and on the side wall of the second word line trench forms a gate oxide layer, a top surface of the gate oxide layer being flush with a top surface of the first insulating layer.

8. The method for fabricating a semiconductor structure according to claim 7, further comprising:

forming a second insulating layer filling up the filling region and being connected to the given isolation layer, the second insulating layer and the given isolation layer being configured to implement electrical insulation between the plurality of active pillars.

9. The method for fabricating the semiconductor structure according to claim 8, wherein after forming the second insulating layer in the second word line trench, the method further comprises:

forming a capacitor contact structure, a portion of the capacitor contact structure being positioned in a region enclosed by the first insulating layer and the given active pillar, the capacitor contact structure being connected to the source region or the drain region of the given active pillar, and a connection end between the capacitor contact structure and the given active pillar is not same as a connection end between a bit line and the given active pillar.

10. The method for fabricating the semiconductor structure according to claim 9, wherein the forming the capacitor contact structure comprises: forming a connection pad in the region enclosed by the first insulating layer and the given active pillar, a top surface of the connection pad being flush with a top surface of the given active pillar;

forming a third insulating layer on the given isolation layer, a contact hole being formed in the third insulating layer; and forming a conductive plug in the contact hole, the conductive plug and the connection pad forming the capacitor contact structure.

11. The method for fabricating the semiconductor structure according to claim 10, wherein the forming the conductive plug in the contact hole comprises:

forming a second conductive layer at a bottom of the contact hole; and forming a barrier layer and a third conductive layer arranged in a stack on the second conductive layer and on a side wall of the contact hole, the third conductive layer filling up a region enclosed by the barrier layer.

12. A semiconductor structure, comprising:

a substrate;

a plurality of active pillars, the plurality of active pillars being arranged at intervals on the substrate;

isolation layers arranged between the plurality of active pillars, the isolation layers being configured to isolate the plurality of active pillars; and a plurality of word lines spaced along the second direction, a part of each of the plurality of word lines being embedded in the plurality of active pillars and being communicated with the plurality of active pillars positioned in the same first direction, each of the plurality of word lines comprising a first word line and a second word line extending along a first direction and arranged at intervals, a first gate channel being formed between the first word line and each of the plurality of active pillars, a second gate channel being formed between the second word line and each of the plurality of active pillars, sum of a width of the first gate channel along the first direction and a width of the second gate channel along the first direction being greater than a perimeter of each of the plurality of active pillars, and the first direction intersecting with the second direction.

13. The semiconductor structure according to claim 12, wherein each of the plurality of active pillars comprises a channel region and a source region and a drain region positioned on two sides of the channel region, the first word line and the second word lines being both opposite to at least a portion of the channel region; and the semiconductor structure further comprises bit lines positioned in the substrate and extending along a second direction, the bit lines being connected to one of the source region and the drain region.

14. The semiconductor structure according to claim 13, wherein the semiconductor structure further comprises a capacitor contact structure, the capacitor contact structure being connected to other one of the source region and the drain region.

15. The semiconductor structure according to claim 14, wherein the capacitor contact structure comprises connection pads and conductive plugs, the connection pads being positioned above the plurality of word lines and being embedded in the plurality of active pillars, the conductive plugs being disposed on the connection pads and being in electrical contact with the connection pads.

16. A semiconductor structure, comprising:
   a substrate;
   an active pillar, the active pillar being arranged at intervals on the substrate;
   a trench, the trench being configured in the active pillar; and
   a word line, the part of word line being configured in the trench.

17. The semiconductor structure according to claim 16, wherein at least two trenches are configured in the active pillar.

18. The semiconductor structure according to claim 16, wherein the depth of the trench is less than the height of the active pillar.

19. The semiconductor structure according to claim 16, further comprising a bit line, the bit line being configured to electrically connect to the bottom of the active pillar;
   a capacitor, the capacitor being configured to electrically connect to the top of the active pillar.

20. The semiconductor structure according to claim 16, wherein the word line is all around the active pillar.

* * * * *